AMPLITUDE CONTROL CIRCUIT FOR SINGLE SIDEBAND GENERATOR BY CONTROLLING THE GAIN OF A DRIVER STAGE

Filed Feb. 9, 1966 3 Sheets-Sheet 1

Sept. 23, 1969 HARUKI TOMONO 3,469,192

AMPLITUDE CONTROL CIRCUIT FOR SINGLE SIDEBAND GENERATOR BY CONTROLLING THE GAIN OF A DRIVER STAGE

Filed Feb. 9, 1966 3 Sheets-Sheet 3

United States Patent Office 3,469,192
Patented Sept. 23, 1969

3,469,192

AMPLITUDE CONTROL CIRCUIT FOR SINGLE SIDEBAND GENERATOR BY CONTROLLING THE GAIN OF A DRIVER STAGE

Haruki Tomono, Kawasaki-shi, Japan, assignor to Fujitsu Limited, Kawasaki, Japan, a corporation of Japan Filed Feb. 9, 1966, Ser. No. 526,197
Int. Cl. H04b *1/68*
U.S. Cl. 325—137 5 Claims

ABSTRACT OF THE DISCLOSURE

A control circuit connected between the final amplification stage and the power supply for such stage and an amplifier in the input of the final amplification stage provides an electrical control signal proportional to the consumed DC power supplied by the power supply to the amplification stage and controls the amplification of the amplifier when the control signal exceeds a predetermined limit. This controls the output signal produced by the final amplification stage.

Description of the invention

The present invention relates to an amplitude control system. More particularly, the invention relates to an amplitude control system for a single sideband generator.

The principal object of the present invention is to provide a new and improved amplitude control system for a single sideband generator.

An object of the present invention is to provide a control system for controlling the consumption of DC input power in a single sideband generator.

An object of the present invention is to provide an amplitude control system for providing a good operating efficiency for a single sideband generator.

In order that the present invention may be readily carried into effect, it will now be described with reference to the accompanying drawings, wherein.

In double sideband generators, the input carrier wave is regulated to control or regulate the consumption of DC input power, regardless of the audio input amplitude. This maintains the effective value of the input power constant, regardless of the volume of the audio input signal. In a single sideband generator, however, as the input carrier wave is reduced, the audio input amplitude determines the output power, the output power increasing in magnitude with the amplitude of the audio input signal. The output power is the DC input power converted by the amplification efficiency.

Figure 1:
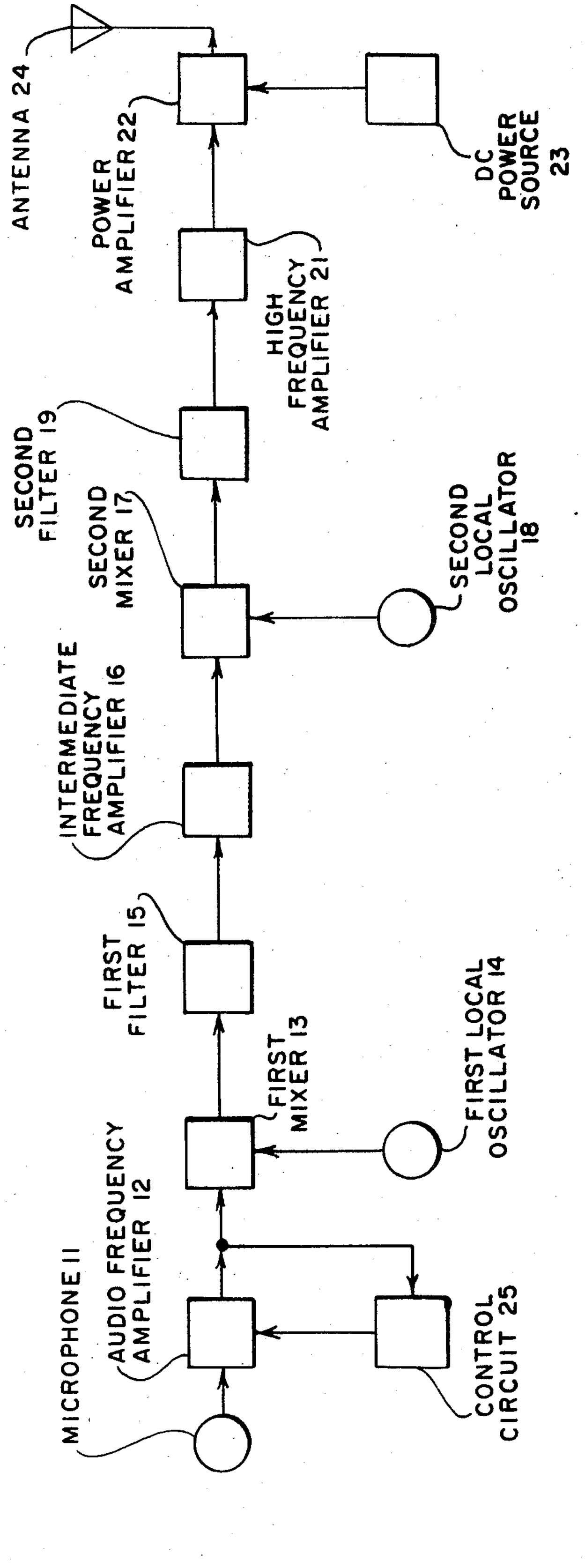
FIG. 1 PRIOR ART
FIG. 1 is a block diagram of an embodiment of an amplitude control system of the prior art.

The DC input power consumption may be reduced by maintaining the effective value of the output power under a predetermined level, which may comprise the maximum magnitude of DC input power multiplied by the amplification efficiency. Thus, it is necessary to limit the input signal to the audio input required for an output power having such predetermined level. In this case, the limit magnitude, value or level has no relation to the consumption of DC input power regardless of its magnitude. This is accomplished by the prior art amplitude control system of FIG. 1. In FIG. 1, the amplitude of the audio frequency amplifier of a single sideband generator is limited to a predetermined level by a control circuit which is energized by the output of said audio frequency amplifier.

In FIG. 1, the single sideband generator is of known type and comprises a microphone 11. An audio frequency amplifier 12 has an input connected to the output of the microphone 11. A first mixer 13 has an input connected to the output of the audio frequency amplifier 12. A first local oscillator 14 has an output connected to the other input of the first mixer 13. A first filter 15 has an input connected to the output of the first mixer 13. An intermediate frequency amplifier 16 has an input connected to the output of the first filter 15. A second mixer 17 has an input connected to the output of the intermediate frequency amplifier 16. A second local oscillator 18 has an output connected to the other input of the second mixer 17. A second filter 19 has an input connected to the output of the second mixer 17. A high frequency amplifier 21 has an input connected to the output of the second filter 19. A power amplifier 22 has an input connected to the output of the high frequency amplifier 21. A DC power source 23 supplies DC power to the other input of the power amplifier 22. The output signal of the power amplifier 22 is transmitted via an antenna 24.

Each of the components 11, 12, 13, 14, 15, 16, 17, 18, 19, 21, 22, 23 and 24 is known and the combination of these components in a single sideband generator is known; each of said components and said single sideband generator functioning in a known manner. A control circuit 25 has an input connected to the output of the audio frequency amplifier 12 and an output connected to an input of said audio frequency amplifier. The control circuit 25 comprises any suitable circuit for limiting the amplitude of the audio frequency amplifier 12 to a predetermined level.

Figure 3:
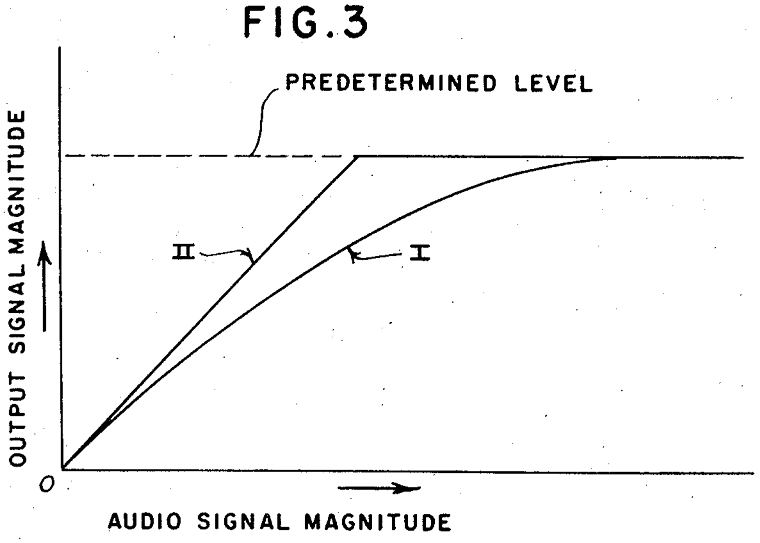
FIG. 3 is a graphical presentation of the output signals of the amplitude control systems of FIGS. 1 and 2.

Due to the regulation or control of the audio frequency amplitude by the control circuit 25, the output signal of the single sideband generator of FIG. 1 is that shown in curve I of FIG. 3. In FIG. 3, the abscissa represents the audio signal magnitude and the ordinate represents the output signal magnitude. As shown by curve I of FIG. 3, the magnitude of the audio signal does not increase above the predetermined level of the output signal, so that the consumption of DC input power is controlled.

A disadvantage of the amplitude control system of FIG. 1 is that the output signal is a maximum only when the audio input signal has a determined amplitude, which amplitude is controlled by the control circuit 25. Thus, the effective value of the DC input current is considerably lower than the regulated DC input, so that the actual output signal has a magnitude which is less than the regulated output signal magnitude and the operating efficiency is very low. Furthermore, since a linear component cannot be utilized in the control circuit 25, curve I is non-linear in configuration.

Figure 2:
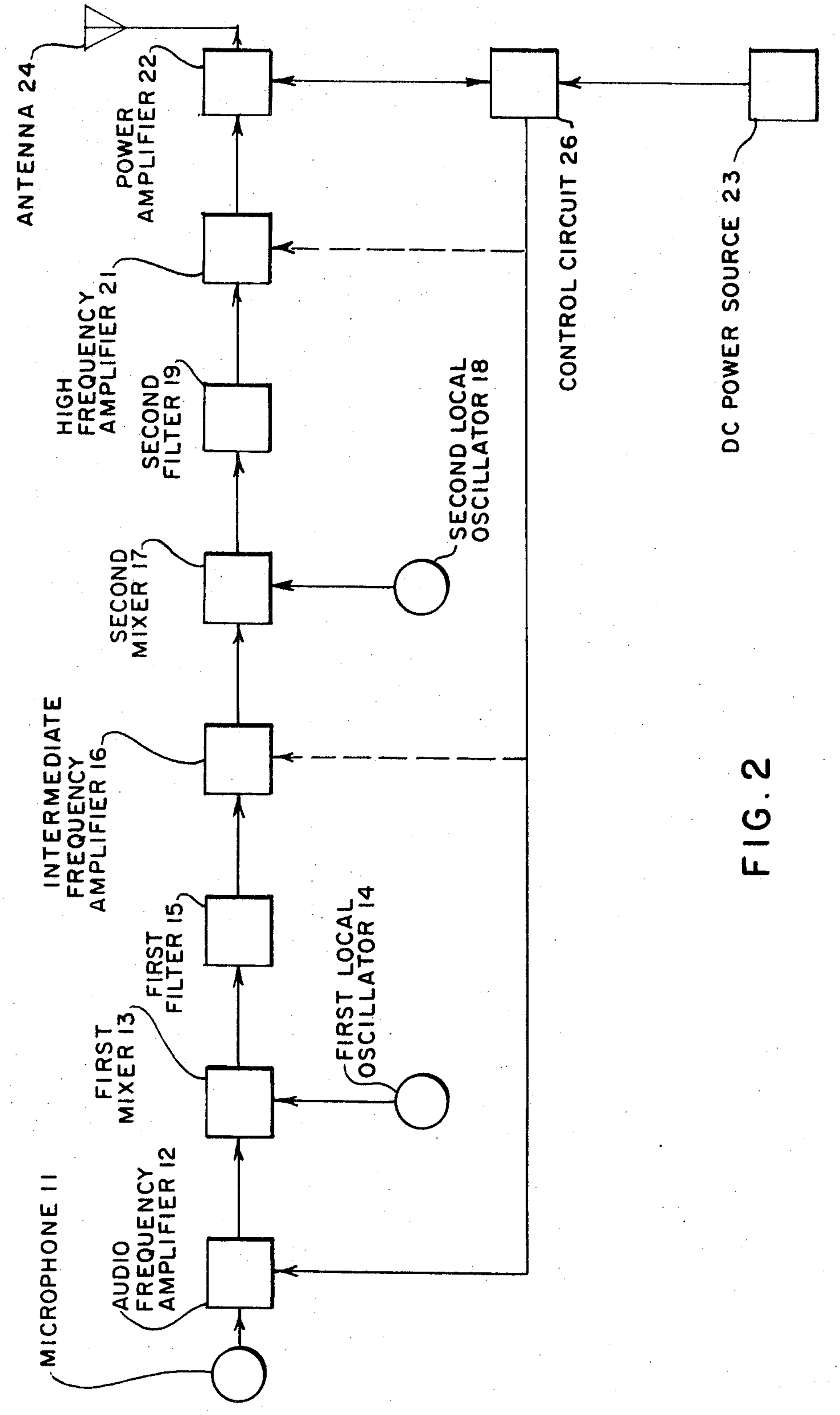
FIG. 2 is a block diagram of an embodiment of the amplitude control system of the present invention.

The amplitude control system of the present invention avoids the disadvantage of the amplitude control system of the prior art and produces an output signal which is linear in configuration and is in the relation of curve II of FIG. 3 to the audio signal. The amplitude control system of the present invention, as shown in FIG. 2, provides a DC input current which has an effective value which is of essentially the same magnitude as the regulated DC input regardless of the magnitude or amplitude of the audio signal, the input current being the DC input to the final amplification stage of the single sideband generator. Thus, in accordance with the present invention, a control circuit provides a voltage or current having a magnitude which is proportional to the consumed DC power at the final amplification stage of the single sideband generator and utilizes such voltage or current to control the amplification of the audio frequency amplifier, the intermediate frequency amplifier or the high frequency amplifier of the single sideband generator.

In FIG. 2, the single sideband generator is the same as the single sideband generator of FIG. 1. Thus, the components 11, 12, 13, 14, 15, 16, 17, 18, 19, 21, 22, 23 and 24 and their interconnection are the same in FIGURES 1 and 2, In FIG. 2, in accordance with the present invention, a control circuit 26 is connected between the power amplifier 22 and the DC power source 23. The control circuit 26 provides a voltage or current having a magnitude proportional to the consumed DC power supplied to the power amplifier 22 by the DC power source 23. The control voltage or current is derived by the control circuit 26 from the power amplifier 22, which is the final amplification stage of the single sideband generator.

The control voltage or current provided by the control circuit 26 is supplied by said control circuit to either the audio frequency amplifier 12, the intermediate frequency amplifier 16 or the high frequency amplifier 21. The control circuit 26 may comprise the circuit shown in FIG. 4, and functions as a detector of the consumed DC power, a comparator and a source of the control signal.

Figure 4:
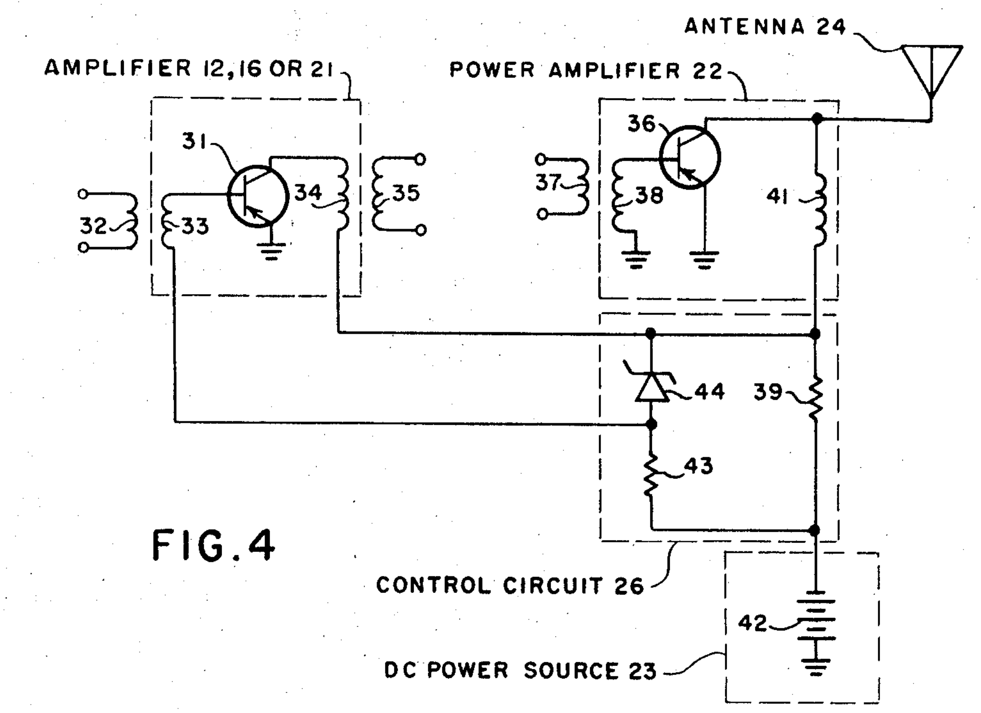
FIG. 4 is a circuit diagram of an embodiment of the control circuit of the amplitude control system of the present invention.

In FIG. 4, circuits are shown for the power amplifier 22, the DC power source 23 and the amplifier to which the control circuit 26 is connected, as well as the circuit of said control circuit. The amplifier may comprise any of the audio, intermediate and high frequency amplifiers 12, 16 and 21. The amplifier 12, 16 or 21 comprises an inductive coupled, grounded emitter transistor 31 having a base electrode utilized as the input, a collector electrode utilized as the output and an emitter electrode connected to ground. An input transformer comprises a primary winding 32 and a secondary winding 33 and an output transformer comprises a primary winding 34 and a secondary winding 35.

The power amplifier 22 comprises a grounded emitter transistor 36 inductively coupled to the output of the high frequency amplifier 21 and having a base electrode utilized as the input, a collector electrode utilized as the output and an emitter electrode connected to ground. An input transformer comprises a primary winding 37 and a secondary winding 38. The antenna 24 is directly connected to the collector electrode of the transistor 36.

The control circuit 26 comprises a first resistor 39 connected in series between one end of an inductor 41 and the DC power source 23, which may comprise a battery 42. The other end of the inductor 41 is connected to the collector electrode of the transistor 36. A second resistor 43 is connected in series with a Zener diode 44 across the first resistor 39. One end of the primary winding 34 of the amplifier is connected to a common point in the connection between the Zener diode 44 and the first resistor 39. The other end of the primary winding 34 of the amplifier is connected to the collector electrode of the transistor 31. One end of the secondary winding 33 of the amplifier is connected to common point in the connection between the second resistor 43 and the Zener diode 44. The other end of the secondary winding 33 of the amplifier is connected to the base electrode of the transistor 31.

The audio signal supplied to the input of the power amplifier 22 has an instantaneous amplitude and the DC input to said power amplifier, which is the effective current flow through the emitter-collector path of the transistor 36 from the DC power source 23, flows through the inductor 41 and the first resistor 39. If the amplitude of the DC current increases and exceeds the predetermined control level, the voltage across the first resistor 39 increases and, accordingly, the voltage across the second resistor 43 and the Zener diode 44 increases.

The transistor 31 of FIG. 4 is suitably biased by any suitable bias circuit in a manner whereby said transistor operates as an amplifier. The bias circuit is not shown in the figures, since each of the transistors shown in FIG. 4 is assumed to be suitably biased and the illustration of an actual bias circuit is not necessary to a clear understanding of the invention. The Zener diode 44 functions to negate any bias in the forward direction between the collector and base electrodes of the transistor 31 and provides a bias in the forward direction between the emitter and base electrodes of said transistor and a bias in the reverse direction between the emitter and collector electrodes of said transistor. The amplifier 12, 16 or 21 of FIG. 4 thus functions as an amplifier in the usual manner.

When the input signal of the transistor 36 of the power amplifier 22 of FIG. 4 has an amplitude which exceeds the amplitude of the usual or normal input signal, the collector current of said transistor increases. When the collector current of the transistor 36 increases, the power consumed by the power amplifier 22 increases and the power supplied by the DC power source 23 increases. The current flow through the resistor 39 of the control circuit 26 thus increases and attains a high value.

When the current through the resistor 39 increases, the voltage across said resistor also increases and attains a high magnitude. When the voltage across the resistor 39 exceeds the Zener breakdown voltage, a reverse current begins to flow in the Zener diode 44. The commencement of the reverse current flow in the Zener diode 44 is abrupt. A current also flows through the resistor 43 since it is connected in series with the Zener diode 44 and the current through the resistor 43 increases, so that the voltage across said resistor also increases.

The resistor 43 is connected to the base electrode of the transistor 31 via the winding 33, so that a positive voltage is then applied to said base electrode. The application of the positive voltage to the base electrode of the transistor 31 switches said transistor to its non-conductive condition, so that the amplifier 12, 16 or 21 ceases operation as an amplifier. When the transistor 31 is switched to its non-conductive condition, the audio signal is cut off just before the consumption of the DC input power reaches an undesired level. Thus, when the voltage of the transistor 31 increases to a magnitude above a predtermined level in accordance with the magnitude of the voltage across the resistor 39, the amplification operation of said transistor is abruptly terminated so that the input signal supplied to the power amplifier 22 is cut off.

The amplitude control system of the present invention thus functions to detect a variation in consumed DC input power provided by the DC power source 23 and to control the amplitude of the audio input signal in accordance with said detected variation, so that it controls the magnitude of the output signal of the single sideband generator in accordance with the magnitude of the audio signal in a linear relation, as shown by curve II of FIG. 3. The operating efficiency of the single sideband generator is thus enhanced by producing a maximum output signal, so that the proportion of output signal to audio input is enlarged. This is attained even when the consumed DC input power of the final amplification stage is determined by a reference value, by controlling or regulating the effective value of the DC input power at the refernce value.

While the invention has been described by means of a specific example and in a specific embodiment, I do not wish to be limited thereto, for obvious modifications will occur to those skilled in the art without departing from the spirit and scope of the invention.

I claim:

1. An amplitude control system for a single sideband generator including a suppressed carrier transmitter having an audio input, a final amplification stage for producing an output signal, an amplifier coupled between the output of said audio input and input of the final amplification stage and power supply means for supplying a DC input power to said final amplification stage, said amplitude control system comprising control circuit meas connected between said final amplification stage and said power supply means and said amplifier for providing an electrical control signal proportional to the consumed DC power supplied by said power supply means to said final amplification stage and for controlling the amplification of said amplifier when said control signal exceeds a predetermined limit thereby controlling the output signal produced by said final amplification stage in linear relation to the audio input, said control circuit means comprising a first resistor connected between said final amplification stage and said power supply means, a second resistor and a Zener diode connected in series with said second resistor across said first resistor and means connecting a common point in the connection between said second resistor and said Zener diode to said amplifier.

2. An amplitude control system as claimed in claim 1, wherein said power supply means compirses a battery connected to said first resistor and said final amplification stage includes an output inductor connected to said first resistor.

3. An amplitude control system as claimed in claim 2, wherein said amplifier comprises an audio frequency amplifier.

4. An amplitude control system as claimed in claim 2, wherein said amplifier comprises an intermediate frequency amplifier.

5. An amplitude control system as claimed in claim 2, wherein said amplifier comprises a high frequency amplifier.

References Cited

UNITED STATES PATENTS

| | | | |
|---|---|---|---|
| 2,981,943 | 4/1961 | Dodington | 325—186 X |
| 3,139,582 | 6/1964 | Spierling | 325—62 X |
| 3,229,034 | 1/1966 | Weisbecker | 178—7.1 |
| 3,281,697 | 10/1966 | Hansen et al. | 325—186 X |
| 3,323,065 | 5/1967 | O'Connor | 325—151 |

ROBERT L. GRIFFIN, Primary Examiner

BENEDICT Y. SAFOUREK, Assistant Examiner

U.S. Cl. X.R.

325—151, 186, 187; 332—38; 330—12.7